(12) United States Patent
Nakano et al.

(10) Patent No.: US 11,912,331 B2
(45) Date of Patent: Feb. 27, 2024

(54) CAPACITANCE SENSOR, METHOD FOR MANUFACTURING SAME, AND RETICULATED SOFT ELECTRODE FOR CAPACITANCE SENSOR

(71) Applicant: Sumitomo Riko Company Limited, Aichi (JP)

(72) Inventors: Masayoshi Nakano, Aichi (JP); Tsubasa Shinozuka, Aichi (JP); Hiroaki Ito, Aichi (JP); Shigeaki Takamatsu, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 440 days.

(21) Appl. No.: 17/192,895

(22) Filed: Mar. 5, 2021

(65) Prior Publication Data
US 2021/0206418 A1 Jul. 8, 2021

Related U.S. Application Data (63) Continuation of application No. PCT/JP2019/020226, filed on May 22, 2019.

(30) Foreign Application Priority Data

Sep. 26, 2018 (JP) .................. 2018-179917

(51) Int. Cl.
*H03K 17/96* (2006.01)
*B62D 1/06* (2006.01)
*G01V 3/08* (2006.01)

(52) U.S. Cl.
CPC .............. *B62D 1/06* (2013.01); *G01V 3/088* (2013.01); *H03K 17/962* (2013.01); *H03K 2217/960755* (2013.01)

(58) Field of Classification Search
CPC ... B62D 1/06; B32B 2250/05; B32B 2250/03; B32B 2250/24; G01V 3/088
See application file for complete search history.

(56) References Cited

U.S. PATENT DOCUMENTS

| 9,253,878 B2 | 2/2016 | Kobayashi et al. |
| 9,860,979 B2 | 1/2018 | Ichiryu et al. |
| (Continued) | | |

FOREIGN PATENT DOCUMENTS

| CN | 105074862 | 11/2015 |
| JP | 2002220776 | 8/2002 |
| (Continued) | | |

OTHER PUBLICATIONS

"Search Report of Europe Counterpart Application", dated Mar. 1, 2021, pp. 1-8.
(Continued)

*Primary Examiner* — Dominic E Hawkins
(74) *Attorney, Agent, or Firm* — JCIPRNET (57) ABSTRACT

A capacitance sensor (1) is provided with two electrode layers (10, 11) and an insulating layer (12) disposed between the electrode layers (10, 11). At least one of the two electrode layers (10, 11) is constituted by a reticulated soft electrode (50) that is formed from a conductive polymer and has a reticulated shape. The conductive polymer comprises a polymer and a conductive material dispersed in the polymer and has an elastic modulus of 1000 MPa or less. This method for manufacturing the capacitance sensor (1) in which the two electrode layers (10, 11) are constituted by the reticulated soft electrode (50) comprises: an electrode manufacturing step in which the reticulated soft electrode (50) is manufactured; and a laminating step in which the reticulated soft electrode (50) is laminated onto the front and back surfaces of the insulating layer (12).

19 Claims, 3 Drawing Sheets

(56) References Cited

U.S. PATENT DOCUMENTS

| | | | |
|---|---|---|---|
| 10,232,858 B2 | 3/2019 | Odate | |
| 2013/0057509 A1* | 3/2013 | Cruz-Hernandez | G06F 3/04166 345/173 |
| 2015/0108818 A1* | 4/2015 | Yamamoto | H03K 17/962 297/452.1 |
| 2015/0369633 A1* | 12/2015 | Karasawa | B62D 1/04 324/686 |
| 2016/0018275 A1* | 1/2016 | Kaneko | G01B 7/22 73/862.626 |
| 2018/0124875 A1* | 5/2018 | Boulbitch | B62D 1/065 |
| 2018/0243924 A1* | 8/2018 | Visell | G01L 5/228 |
| 2018/0290356 A1* | 10/2018 | Isohätälä | H01F 41/04 |
| 2019/0056824 A1 | 2/2019 | Ichiki et al. | |
| 2019/0332225 A1 | 10/2019 | Nakahira et al. | |

FOREIGN PATENT DOCUMENTS

| | | |
|---|---|---|
| JP | 2002252493 | 9/2002 |
| JP | 2007262623 | 10/2007 |
| JP | 2007314911 | 12/2007 |
| JP | 2010109121 | 5/2010 |
| JP | 2014190856 | 10/2014 |
| JP | 2016010876 | 1/2016 |
| JP | 2016219782 | 12/2016 |
| JP | 2017087883 | 5/2017 |
| JP | 2017171298 | 9/2017 |
| JP | 2018063761 | 4/2018 |
| JP | 2018075849 | 5/2018 |
| WO | 2013146262 | 10/2013 |
| WO | 2014123222 | 8/2014 |
| WO | 2017183296 | 10/2017 |
| WO | 2017187805 | 11/2017 |
| WO | 2018155106 | 8/2018 |

OTHER PUBLICATIONS

"Written Opinion of the International Searching Authority (Form PCT/ISA/237) of PCT/JP2019/020226," dated Jul. 16, 2019, with English translation thereof, pp. 1-17.

"Office Action of Europe Counterpart Application", dated Oct. 27, 2022, pp. 1-10.

"Office Action of China Counterpart Application" with English translation thereof, dated Mar. 1, 2022, p. 1-p. 17.

"International Search Report (Form PCT/ISA/210)" of PCT/JP2019/020226, dated Jul. 16, 2019, with English translation thereof, pp. 1-4.

* cited by examiner

CAPACITANCE SENSOR, METHOD FOR MANUFACTURING SAME, AND RETICULATED SOFT ELECTRODE FOR CAPACITANCE SENSOR

CROSS-REFERENCE TO RELATED APPLICATIONS

This application is a Continuation of PCT International Application No. PCT/JP2019/020226 filed on May 22, 2019, which claims priority under 35 U.S.C. § 119(a) to Japanese Patent Application No. 2018-179917 filed on Sep. 26, 2018. The above application is hereby expressly incorporated by reference, in its entirety, into the present application.

TECHNICAL FIELD

The present invention relates to a capacitance sensor and a method for manufacturing the same, and particularly to an electrode layer of the capacitance sensor.

BACKGROUND ART

Various sensors for detecting the condition of an occupant are installed in vehicles such as automobiles. For example, Patent Literature 1 and 2 disclose a capacitance sensor disposed in a rim part (grip) of a steering wheel. The sensor includes a shield layer and a sensor layer and detects whether or not a driver is in contact with the steering wheel on the basis of a change in capacitance generated between an occupant and the sensor layer.

Figure 5:
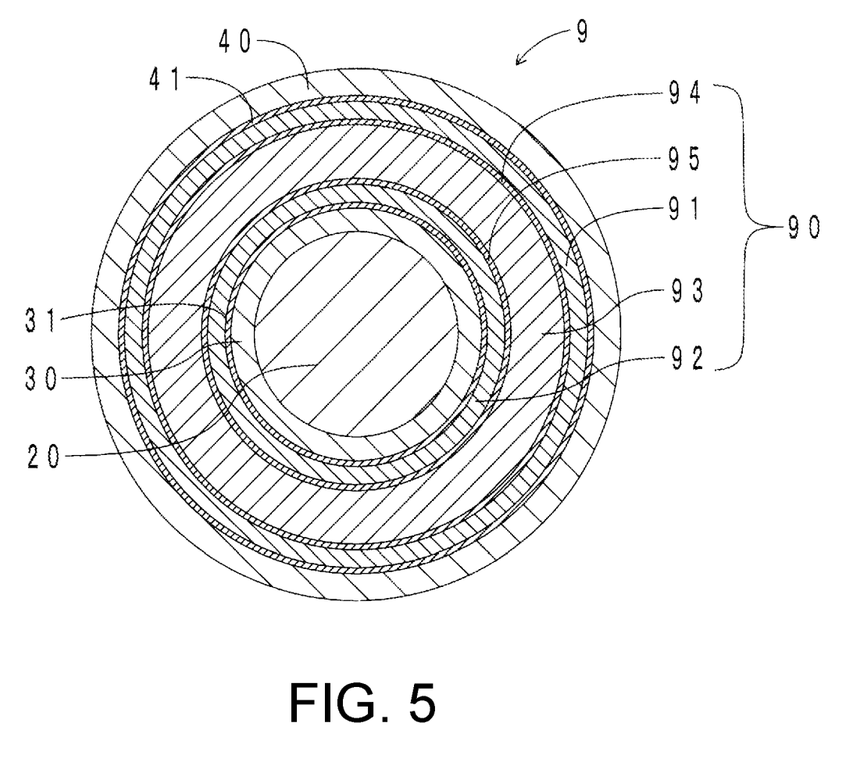
FIG. 5 is a radial cross-sectional view of a conventional steering wheel.

FIG. 5 illustrates a radial cross-sectional view of a conventional steering wheel including a capacitance sensor. As illustrated in FIG. 5, a steering wheel 9 includes a core body 20, a heater layer 30, a capacitance sensor 90, and a surface skin 40. The steering wheel 9 has a laminated structure in which a plurality of layers is laminated radially outward from the core body 20. The heater layer 30 covers an outer circumferential surface of the core body 20. The capacitance sensor 90 covers an outer circumferential surface of the heater layer 30. The surface skin 40 covers an outer circumferential surface of the capacitance sensor 90. It is the surface skin 40 which is touched by a driver.

The capacitance sensor 90 includes a detection electrode layer 91, a shield electrode layer 92, and an insulating layer 93. The detection electrode layer 91 is disposed on the surface skin 40 side and generates a capacitance between itself and a driver's hand (object to be detected). The shield electrode layer 92 is disposed on the heater layer 30 side and shields noise from the heater layer 30. The insulating layer 93 is disposed between the detection electrode layer 91 and the shield electrode layer 92. The detection electrode layer 91 and the insulating layer 93 are bonded by an adhesive layer 94, and the shield electrode layer 92 and the insulating layer 93 are bonded by the adhesive layer 95. Similarly, the heater layer 30 and the shield electrode layer 92 are bonded by an adhesive layer 31, and the surface skin 40 and the detection electrode layer 91 are bonded by an adhesive layer 41.

CITATION LIST

Patent Literature

[Patent Literature 1]
  PCT International Publication No. WO 2014/123222
[Patent Literature 2]
  Japanese Patent Laid-Open No. 2014-190856
[Patent Literature 3]
  Japanese Patent Laid-Open No. 2007-314911
[Patent Literature 4]
  Japanese Patent Laid-Open No. 2007-262623
[Patent Literature 5]
  Japanese Patent Laid-Open No. 2010-109121
[Patent Literature 6]
  Japanese Patent Laid-Open No. 2002-220776

As described above, in the conventional steering wheel, since the layers to be laminated are bonded to each other with an adhesive, a step of applying the adhesive, a step of laminating the layers together, or the like is required, causing an increase in number of manufacturing steps and costs.

Also, as a material of the electrode layer, a metal such as silver or copper, or a carbon material is used as described in Patent Literature 1. When the capacitance sensor is attached to the steering wheel, it is necessary to wind the capacitance sensor around the core body while elongating the capacitance sensor. However, since a metal or a carbon material does not have flexibility, it is difficult to elongate a metal or a carbon material. Therefore, a shape of the sensor is devised or the like as described in the literature. Patent Literature 2 describes that a material in which metal powder is blended into a rubber or a resin is used as a material of the shield electrode layer. However, the flexibility of these materials also is not sufficient and when the materials are elongated, the contact between particles of the metal powder (conductive material) breaks down, and the conductivity is likely to deteriorate or be lost.

On the other hand, a fabric-like electrode using metal-plated conductive threads has been proposed as described in Patent Literature 3 and 4. Also, Patent Literature 5 describes that an electrode layer can be formed by knitting a carbon material or a metal into a mesh shape. However, such a conductive fabric has poor flexibility. Therefore, it is difficult to wind the conductive fabric around a steering wheel, and the conductivity is impaired when it is elongated. Also, the conductive fabric is relatively expensive. When the conductive fabric is treated with respect to being recycling, since metal components remain after incineration, or metal components remain as foreign matter in a fused material, there is a problem that reusing it as a conductive fabric is difficult.

According to an aspect of the present invention, there is provided an electrode which can be used as an electrode layer of a capacitance sensor, has flexibility, and in which deterioration or loss of conductivity do not easily occur even when it is elongated. According to another aspect of the present invention, there is provided a capacitance sensor which utilizes this electrode and has excellent flexibility, and a method for manufacturing this capacitance sensor at low cost.

SUMMARY OF INVENTION (1) A first aspect of the present invention is a capacitance sensor including two electrode layers, and an insulating layer disposed between the electrode layers, in which at least one of the two electrode layers includes a reticulated soft electrode having a reticulated shape formed of a conductive polymer, and the conductive polymer includes a polymer and a conductive material dispersed in the polymer and has an elastic modulus of 1000 MPa or less.

(2) A second aspect of the present invention is a method for manufacturing a capacitance sensor of the present invention is a method for manufacturing a capacitance sensor including two electrode layers, and an insulating layer disposed between the electrode layers, in which the two electrode layers include a reticulated soft electrode having a reticulated shape formed of a conductive polymer, and the conductive polymer includes a polymer and a conductive material dispersed in the polymer and has an elastic modulus of 1000 MPa or less, and the method for manufacturing a capacitance sensor includes an electrode manufacturing step of manufacturing the reticulated soft electrode, and a laminating step of laminating the reticulated soft electrode on both front and back surfaces of the insulating layer.

(3) A third aspect of the present invention is a reticulated soft electrode for a conductive sensor of the present invention is formed of a conductive polymer including a polymer and a conductive material dispersed in the polymer and having an elastic modulus of 1000 MPa or less, and has a reticulated shape.

DESCRIPTION OF EMBODIMENTS (1) The capacitance sensor of the present invention includes a reticulated soft electrode as the electrode layer. The reticulated soft electrode is formed of a conductive polymer having a relatively low elastic modulus and has a reticulated shape. Therefore, the reticulated soft electrode has high flexibility, and thus does not easily break and the conductivity thereof does not easily deteriorate even when it is greatly elongated. Therefore, the capacitance sensor of the present invention is flexible as a whole and can be easily installed on a curved surface such as the steering wheel described above. Also, the reticulated soft electrode has a matrix formed of a polymer, and no metal components remain in a fused material when a carbon material is used as the conductive material. Therefore, it is easily reused.

The reticulated soft electrode includes a polymer. Therefore, when an adjacent member such as the insulating layer is made of a thermoplastic elastomer, adhesiveness of the reticulated soft electrode to the adjacent member can be utilized to fix them to each other without using an adhesive. Also, when the adjacent member is softened by heating, the adjacent member can be heated and fused to the reticulated soft electrode so that they are fixed to each other. Further, a part of the softened adjacent member can be integrated therewith by being impregnated into voids of the reticulated soft electrode. Particularly, when the reticulated soft electrode and the adjacent member are polymer types of the same type, they can be firmly integrated due to compatibility. As described above, when the reticulated soft electrode is used, since use of an adhesive that has been conventionally required to fix adjacent layers to each other can be eliminated, the number of manufacturing steps can be curtailed and reduction in cost can be achieved. Therefore, the capacitance sensor of the present invention can be relatively inexpensively configured. Also, when they are integrated, since a thickness can be made smaller than that in a conventional laminating method using an adhesive, an effect of improving flexibility is also achieved.

(2) According to the method for manufacturing a capacitance sensor of the present invention, it is possible to easily manufacture the capacitance sensor of the present invention having a form in which the two electrode layers sandwiching the insulating layer therebetween include the reticulated soft electrode by simply laminating the reticulated soft electrode on both the front and back surfaces of the insulating layer. Also, according to the method for manufacturing a capacitance sensor of the present invention, since the use of an adhesive that has been conventionally required to fix adjacent layers to each other can be eliminated by utilizing adhesiveness of the insulating layer and the reticulated soft electrode, fusing and bonding both of them, or causing the insulating layer to be impregnated into the voids of the reticulated soft electrode, the number of manufacturing steps can be curtailed and reduction in cost can be achieved. Therefore, the capacitance sensor of the present invention can be manufactured at a relatively low cost.

(3) The reticulated soft electrode for a capacitance sensor of the present invention is formed of a conductive polymer having a relatively small elastic modulus and has a reticulated shape. Therefore, the reticulated soft electrode has high flexibility, and thus does not easily break and the conductivity thereof does not easily deteriorate even when it is greatly elongated. Therefore, the reticulated soft electrode is suitable as an electrode layer of a capacitance sensor that requires flexibility. Also, the reticulated soft electrode for a capacitance sensor of the present invention has a matrix formed of a polymer, and no metal components remain in a fused material when a carbon material is used as the conductive material. Therefore, it is easily reused.

Incidentally, Patent Literature 6 describes a conductive reticulated body in which a large number of conductive continuous filaments made of a thermoplastic resin containing carbon black are superposed in a reticulated shape, and fusion-bonded at intersections thereof to be integrated. The conductive reticulated body is integrated with a water shielding sheet or the like and used for water leak detection. Therefore, the conductive reticulated body is required to have high compressive stress and air permeability but is not required to have flexibility. Also, as described in claim 5 of this literature, the conductive reticulated body is corrugated in an irregular shape in a thickness direction and has an uneven thickness. Therefore, when the conductive reticulated bodies are disposed with an insulating layer sandwiched therebetween, a distance between electrodes is not constant and sensing accuracy deteriorates. Therefore, the conductive reticulated body is not suitable as an electrode layer of a capacitance sensor.

First, one embodiment of a reticulated soft electrode for a capacitance sensor, and a capacitance sensor and a method for manufacturing the same of the present invention will be described, and then another embodiment will be described.

First Embodiment

[Configuration of Capacitance Sensor]

Figure 1:
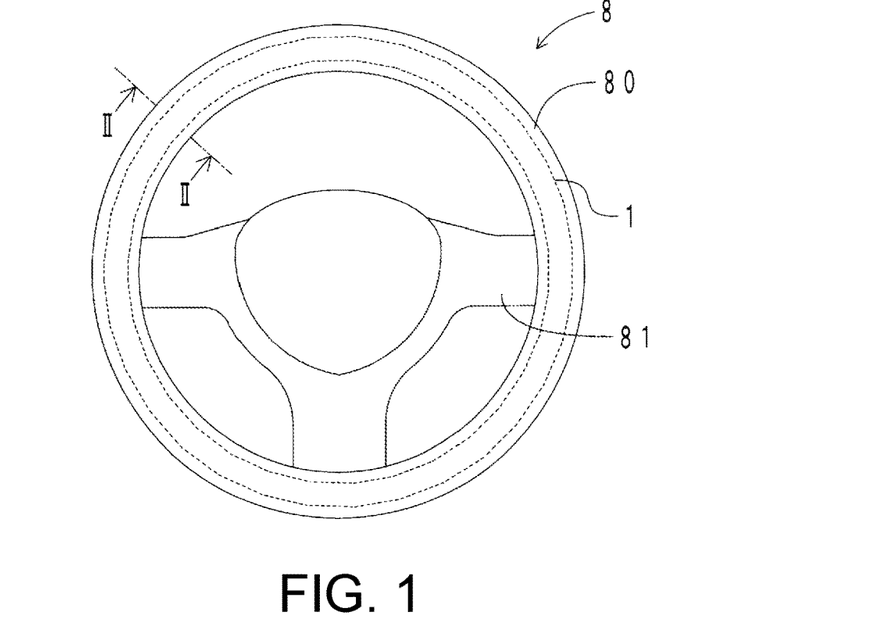
FIG. 1 is a front view of a steering wheel in which a capacitance sensor of a first embodiment is disposed.
Figure 2:
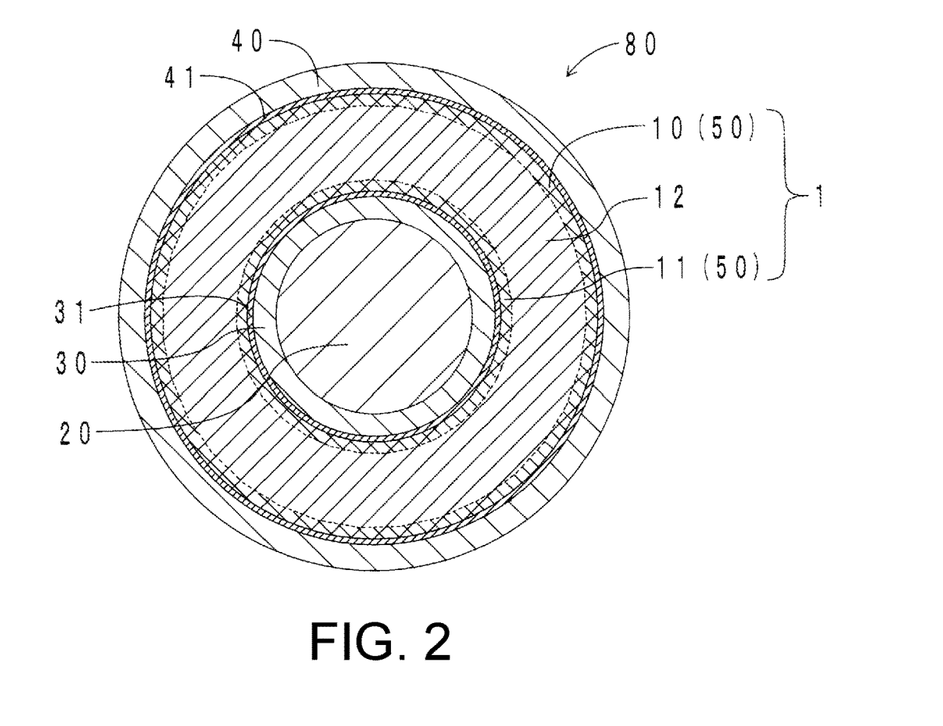
FIG. 2 is a cross-sectional view along line II-II of FIG. 1.
Figure 3:
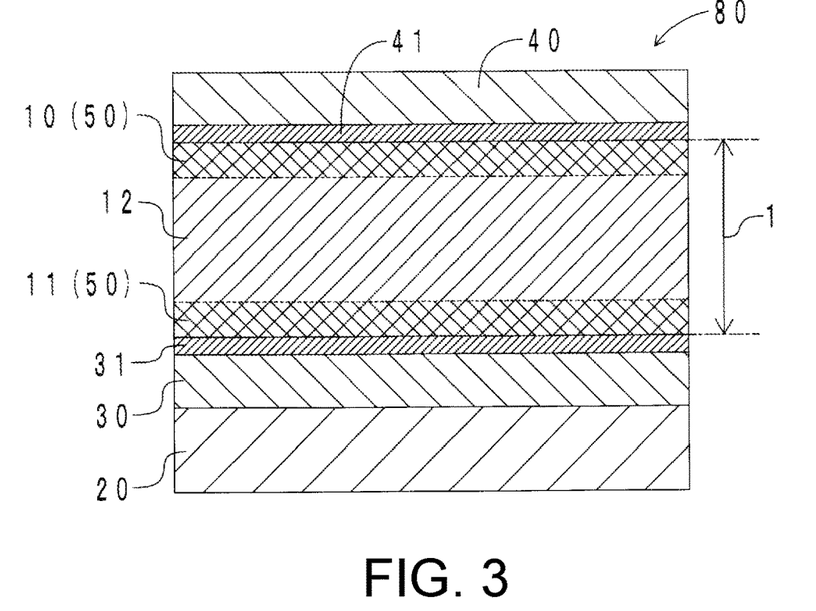
FIG. 3 is a schematic cross-sectional view for illustrating a laminated structure of the steering wheel.
Figure 4:
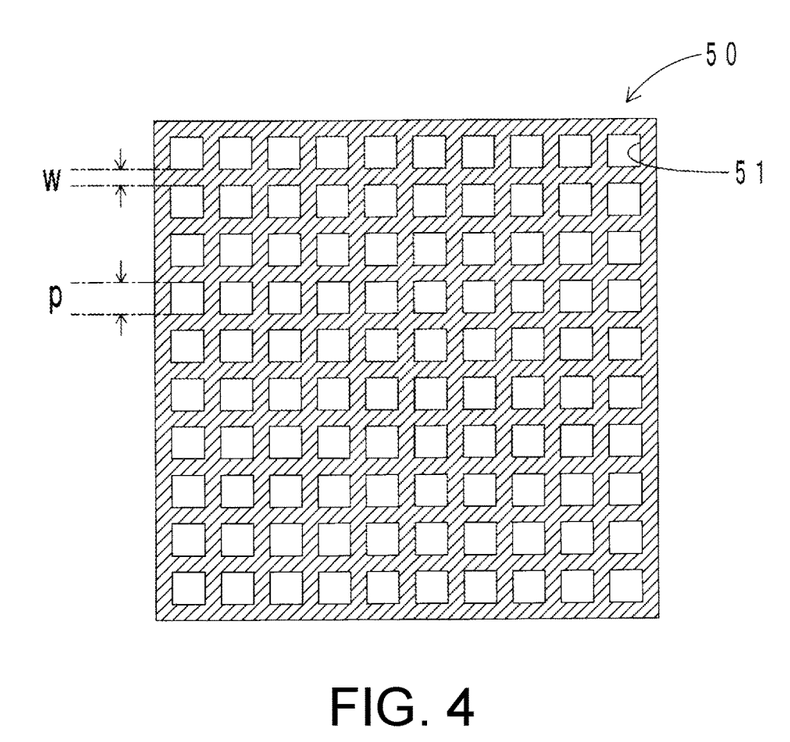
FIG. 4 is a schematic plan view of a reticulated soft electrode used for a detection electrode layer and a shield electrode layer of the capacitance sensor.

First, a configuration of a capacitance sensor of the present embodiment will be described. FIG. 1 illustrates a front view of a steering wheel in which a capacitance sensor of the present embodiment is disposed. FIG. 2 illustrates a cross-sectional view along line II-II of FIG. 1. FIG. 3 illustrates a schematic cross-sectional view for illustrating a laminated structure of the steering wheel. FIG. 4 illustrates a schematic plan view of a reticulated soft electrode used for a detection electrode layer and a shield electrode layer of the same capacitance sensor. In FIG. 4, for the sake of convenience, a conductive polymer portion is indicated by hatching.

As illustrated in FIG. 1, the steering wheel 8 includes a rim part 80 and a connecting part 81. The rim part 80 has an annular shape and is gripped by a driver. The connecting part 81 connects the rim part 80 and a steering shaft (not illustrated). As illustrated by a dotted line in FIG. 1, a capacitance sensor 1 is disposed in the rim part 80.

As illustrated in FIGS. 2 and 3, the rim part 80 includes a core body 20, a heater layer 30, the capacitance sensor 1, and a surface skin 40.

The core body 20 is a solid rod made of a metal and has an annular shape. The core body 20 is connected to the steering shaft via the connecting part 81.

The heater layer 30 is made of a nonwoven fabric in which a heating wire is disposed. The heater layer 30 covers an outer circumferential surface of the core body 20. The heater layer 30 heats the rim part 80 due to the heating wire generating heat when power is supplied. An adhesive layer 31 is disposed between the heater layer 30 and the capacitance sensor 1. The adhesive layer 31 bonds the heater layer 30 and the capacitance sensor 1 (specifically, a shield electrode layer 11 to be described below).

The capacitance sensor 1 has a flexible sheet shape. The capacitance sensor 1 is wound (one turn) around the core body 20 from above the heater layer 30. The capacitance sensor 1 covers an outer circumferential surface of the heater layer 30. The capacitance sensor 1 includes a detection electrode layer 10, the shield electrode layer 11, and an insulating layer 12.

The detection electrode layer 10 includes a reticulated soft electrode 50. The reticulated soft electrode 50 is formed of a conductive polymer in which carbon black is dispersed in a thermoplastic elastomer or the like and has a reticulated shape. An elastic modulus of the conductive polymer serving as a material of the reticulated soft electrode 50 is 15 MPa, and a volume resistivity thereof is 2.0 Ω·cm. Even when the conductive polymer is elongated in one direction by 25%, the volume resistivity increases by only about twice. As illustrated in FIG. 4, the reticulated soft electrode 50 has a large number of square voids 51. A line width w forming the reticulation is 0.8 mm, a line thickness (electrode thickness) is 0.2 mm, and an interval (pitch) p between the lines is 3 mm. The reticulated soft electrode 50 is included in the concept of the reticulated soft electrode for a capacitance sensor of the present invention. The detection electrode layer 10 is disposed on the surface skin 40 side and generates a capacitance between itself and a hand of the driver (object to be detected). As illustrated by a dotted line in FIGS. 2 and 3, substantially the entire detection electrode layer 10 is embedded in the insulating layer 12.

The shield electrode layer 11 includes the same reticulated soft electrode 50 as the detection electrode layer 10. The shield electrode layer 11 is disposed on the heater layer 30 side. The shield electrode layer 11 is grounded and shields noise from the heater layer 30. As illustrated by a dotted line in FIGS. 2 and 3, substantially the entire shield electrode layer 11 is embedded in the insulating layer 12.

The insulating layer 12 is disposed between the detection electrode layer 10 and the shield electrode layer 11. The insulating layer 12 is made of a thermoplastic elastomer containing magnesium oxide particles. A volume resistivity of the insulating layer 12 is $1 \times 10^{13}$ Ω·cm, and an elastic modulus thereof is 10 MPa.

The surface skin 40 is made of a resin and covers an outer circumferential surface of the capacitance sensor 1. An adhesive layer 41 is disposed between the surface skin 40 and the capacitance sensor 1. The adhesive layer 41 bonds the surface skin 40 and the capacitance sensor 1 (specifically, the detection electrode layer 10).

[Method for Manufacturing Capacitance Sensor]

Next, a method for manufacturing the capacitance sensor of the present embodiment will be described. First, the reticulated soft electrode 50 is manufactured as follows (electrode manufacturing step). Carbon black is added to a matrix material such as a thermoplastic elastomer, and this is kneaded using a twin-screw extruder to obtain a pellet-shaped conductive composition. The obtained conductive composition is subjected to rotary extrusion forming and further pressed under heating for smoothing it without irregularities of intersections, and thereby a reticulated sheet (the reticulated soft electrode 50) is manufactured. Next, the reticulated soft electrode 50 for the detection electrode layer 10 is superposed on a surface of the insulating layer 12, and the reticulated soft electrode 50 for the shield electrode layer 11 is superposed on a back surface thereof to form a laminate. Then, the laminate is pressed in a lamination direction under heating. By doing as such, the softened insulating layer 12 is impregnated into the voids 51 of the reticulated soft electrode 50, and the insulating layer 12 and the reticulated soft electrode 50 are fused. At this time, the entire reticulated soft electrode 50 is embedded in the insulating layer 12 (a fusing bonding step, an embedding step, and a laminating step). In this way, the capacitance sensor 1 in which the reticulated soft electrode 50 (the detection electrode layer 10 and the shield electrode layer 11) is embedded in the insulating layer 12 and integrated is manufactured.

The manufactured capacitance sensor 1, with the shield electrode layer 11 on an inward side, is wound to cover the outer circumferential surface of the heater layer 30 which is wound around the core body 20. A surface of the heater layer 30 is coated with an adhesive. Thereby, the heater layer 30 and the shield electrode layer 11 are bonded together. Then, the surface skin is wound to cover the detection electrode layer 10. A back surface of the surface skin 40 is coated with an adhesive. Thereby, the surface skin 40 and the detection electrode layer 10 are bonded together. In this way, the rim part 80 of the steering wheel 8 is manufactured.

[Behavior of Capacitance Sensor]

Next, a behavior of the capacitance sensor of the present embodiment will be described. When a driver's hand (having conductivity and grounded through the human body) has approached the surface skin 40, a capacitance is generated between the detection electrode layer and the hand. A detection circuit unit (not illustrated) is electrically connected to the detection electrode layer 10. The detection circuit unit calculates an amount of change in capacitance between a state in which a hand has not approached and a state in which a hand has approached and determines whether or not the driver is in contact with the steering wheel 8 on the basis of the calculated value.

[Operation and Effects]

Next, the operation and effects of the reticulated soft electrode, and the capacitance sensor and a method for manufacturing the same of the present embodiment will be described. According to the capacitance sensor 1, the detection electrode layer 10 and the shield electrode layer 11 include the reticulated soft electrode 50, and the insulating layer 12 is also made of a flexible thermoplastic elastomer. Therefore, the entire capacitance sensor 1 is flexible and can be wound around the core body 20 while being elongated. Also, a tactile sensation of the rim part 80 also is satisfactory.

The detection electrode layer 10 and the shield electrode layer 11 (the reticulated soft electrode 50) do not easily break and the conductivity thereof does not easily deteriorate even when they are greatly elongated. Therefore, a sensing performance does not easily deteriorate and durability thereof is excellent. Also, since the reticulated soft electrode 50 does not contain a metal, the reticulated soft electrode 50 can be easily reused.

There is no adhesive layer between the insulating layer 12 and each of the detection electrode layer 10 and the shield electrode layer 11. That is, in the capacitance sensor 1, since a thermoplastic elastomer is used for the insulating layer 12, the thermoplastic elastomer being softened by heating can be utilized to fix the insulating layer 12 and each of the detection electrode layer 10 and the shield electrode layer 11 without using an adhesive. According to the extent to which there is no adhesive layer, the sensor is made thinner than that in conventional cases, and thereby the flexibility is further improved. According to the method for manufacturing the capacitance sensor of the present embodiment, when the insulating layer 12 is sandwiched between the two reticulated soft electrodes 50 and pressed under heating, the insulating layer 12 is impregnated into the voids 51 of the reticulated soft electrodes 50, and the insulating layer 12 and the reticulated soft electrodes 50 can be fixed without using an adhesive. Thereby, an adhesive coating step which has been conventionally required is unnecessary, and thus reduction in costs can be achieved by reduction in the number of manufacturing steps. Also, the reticulated soft electrode 50 can be easily manufactured at low cost by causing the conductive composition to be subjected to rotary extrusion forming. Accordingly, the capacitance sensor 1 is made relatively inexpensive.

OTHER EMBODIMENTS

Embodiments of a reticulated soft electrode for a capacitance sensor, and a capacitance sensor and a method for manufacturing the same according to the present invention are not limited to the above-described embodiment, and the present invention can be implemented in various forms with modifications, improvements, or the like that can be made by those skilled in the art within a range not departing from the gist of the present invention. Hereinafter, each of them will be described in detail.

[Reticulated Soft Electrode for Capacitance Sensor]

The reticulated soft electrode for a capacitance sensor of the present invention (hereinafter simply referred to as "reticulated soft electrode of the present invention" in some cases) is formed of a conductive polymer and has a reticulated shape. The conductive polymer includes a polymer and a conductive material dispersed in the polymer and has an elastic modulus of 1000 MPa or less.

(1) Conductive Polymer

Polymers that form a matrix of the conductive polymer are not particularly limited and can include thermoplastic resins, thermoplastic elastomers, thermosetting resins, and thermosetting elastomers, and are preferably one or more types selected from thermoplastic resins and thermoplastic elastomers in consideration of flexibility and formability into a reticulated shape. As the thermoplastic resins, resins of olefin type and polyamide type are suitable. Among olefin-based resins, polymethylpentene homopolymer, a copolymer of polymethylpentene and another olefin-based resin, polypropylene homopolymer, a copolymer of polypropylene and another olefin-based resin, or the like is preferable from a viewpoint of satisfactory shape retention and satisfactory retention of mechanical properties at a high temperature. Among polyamide-based resins, PA11, PA12, PA612, PA610, PA1212, PA1010, or the like is preferable. As thermoplastic elastomers, urethane-type, acrylic type, ester-type, polyamide-type, olefin-type, and styrene-type can be exemplified, and particularly, urethane-type and acrylic type are preferable among them. Among urethane-based thermoplastic elastomers, ether-types and carbonate-types are preferable from a viewpoint of not readily hydrolyzing.

Generally, since an elastic modulus of a resin is large, a resin is preferably softened by mixing resins together or mixing a resin and an elastomer to form a mixed resin, or by being blended with an oil or a plasticizer. Examples thereof may include a mixed material of an olefin-based resin and a thermoplastic elastomer, a mixed material of a polyamide-based resin with a modified olefin-based resin or a thermoplastic elastomer, and the like. The thermoplastic elastomer that is mixed with the polyolefin-based resin is preferably SEBS, SBS, EPDM, EPM, or the like. Also, in a case of the mixing, a compatibilizer such as ethylene propylene-polypropylene copolymer (EP-PP copolymer) may be added to improve properties such as strength and elongation.

The modified olefin-based resin that is mixed with the polyamide-based resin is preferably polyethylene, polypropylene, or the like, and the thermoplastic elastomer that is alloyed with the polyamide-based resin is preferably SEBS, SBS, EPDM, EPM, or the like. In this case, carboxylic acid-modified polypropylene, carboxylic acid-modified polyethylene, or the like may be added as the compatibilizer.

The conductive material dispersed in the polymer is not particularly limited and can include a metal material and a carbon material, and it is preferable to use a carbon material in consideration of flexibility and recyclability. As the carbon material, carbon black, carbon fiber, carbon nanotubes, graphite, or the like can be exemplified. Examples of the graphite include general powder graphite, expandable graphite, expanded graphite, thin layer graphite, and graphene. Among them, from a viewpoint of high conductivity, it is preferable to use one or more types selected from carbon black such as Ketjen black and acetylene black, carbon nanotubes, and graphite. Furthermore, from a viewpoint of being relatively inexpensive and having high conductivity, it is preferable to use one or more types selected from carbon black and graphite. Further, the conductive polymer may contain a crosslinking agent, a crosslinking accelerator, a dispersant, a reinforcing material, a plasticizer, an antiaging agent, a colorant, or the like in addition to the polymer and the conductive material.

An elastic modulus of the conductive polymer is 1000 MPa or less. From a viewpoint of flexibility, it is preferably 500 MPa or less, and more preferably 250 MPa or less. In the present specification, the elastic modulus is calculated from a slope of a linear region of a stress-elongation curve obtained by the tensile test specified in JIS K6251:2017. The tensile test is performed using a dumbbell-shaped No. 5 type test piece having a thickness of 2 mm at a tensile speed of 100 mm/min.

From a viewpoint of securing a desired sensing performance when the reticulated soft electrode of the present invention is used as the electrode layer of the capacitance sensor, a volume resistivity of the conductive polymer is preferably 100 Ω·cm or less. It is more preferably 50 Ω·cm or less, 10 Ω·cm or less, and still more preferably 3 Ω·cm or less. Also, it is preferable that electric resistance does not easily increase even when the electrode layer is elongated. Therefore, a volume resistivity when the conductive polymer is elongated in one direction by 25% is preferably 10 times the volume resistivity before the elongation or less. It is more preferably 5 times or less, and still more preferably 3 times or less.

When it is assumed that the capacitance sensor is used in an interior of an automobile over a long period of time, it is required that a volume resistivity of the electrode layer do not easily change under a high temperature and high humidity and that a material of the electrode layer do not easily deteriorate. When this point is considered, when a pressure cooker test (PCT) in which hydrolysis of the conductive polymer is accelerated is performed, a proportional change of the volume resistivity after the test is preferably within ±30%. The proportional change of the volume resistivity is more preferably within ±15%, and still more preferably within ±10%. When a volume resistivity before the test is $R_0$ and a volume resistivity after the test is $R_1$, an expression for calculation of the proportional change of the volume resistivity is represented by the following expression (i).

$$\text{Proportional change of volume resistivity} = (R_1 - R_0)/R_0 \times 100 \quad \text{(i)}$$

Similarly, a retention rate of elongation at break after the PCT test is preferably 50% or more and 150% or less. The retention rate of the elongation at break is more preferably 75% or more and 130% or less, and still more preferably 85% or more and 120% or less. When an elongation at break before the test is $E_0$ and an elongation at break after the test is $E_1$, an expression for calculation of the retention rate of the elongation at break is represented by the following expression (ii).

$$\text{Retention rate of elongation at break} = E_1/E_0 \times 100 \quad \text{(ii)}$$

In the present specification, the PCT test is assumed to be performed by maintaining a test piece of the conductive polymer for 120 hours at a temperature of 121° C. and a pressure of 202.65 kPa (2 atm).

When the capacitance sensor is formed, the reticulated soft electrode of the present invention may be heated to be integrated with the insulating layer. In this case, the conductive polymer is required to have a large melt viscosity even at a high temperature of about 160 to 200° C. which is a softening temperature of the insulating layer, high shape retention, high retention of mechanical properties, and physical properties which are not easily changed. When this point is considered, the conductive polymer preferably satisfies at least one of the following conditions (A), (B), and (C).

(A) An elastic modulus of the conductive polymer at a certain temperature of 120° C. or higher and 180° C. or lower is higher than an elastic modulus of the insulating layer measured at the same temperature.

(B) An elongation at break of the conductive polymer at a certain temperature of 120° C. or higher and 180° C. or lower is larger than an elongation at break of the insulating layer measured at the same temperature.

(C) A melt viscosity of the conductive polymer at 200° C. is higher than a melt viscosity of the insulating layer at 200° C.

In regard to the conditions (A) and (B), the elastic moduli and the elongations at break at both the lower limit of 120° C. and the upper limit of 180° C. of the temperature range are compared, and when a value of the conductive polymer is equal to or less than a value of the insulating layer at any temperature or when measurement cannot be performed, it is determined that the conditions are not satisfied.

(2) Reticulated Shape

A line width, a cross-sectional shape of the line, a thickness, a pitch, a shape of the voids, or the like in the reticulated soft electrode of the present invention may be appropriately determined in consideration of flexibility, conductivity, a sensing performance, shape retention, or the like. For example, the line width may be 0.1 mm or more, 0.2 mm or more, 0.3 mm or more, 4.0 mm or less, 2.0 mm or less, or 1.0 mm or less. Examples of the cross-sectional shape of the line may include a circle, an ellipse, a rectangle, a square, and the like. The thickness of the line is preferably 0.05 mm or more, 0.1 mm or more, 0.5 mm or less, or 0.2 mm or less. The pitch is preferably 0.5 mm or more, 0.7 mm or more, 1 mm or more, 200 mm or less, 30 mm or less, or 5 mm or less. Since the voids become larger as the pitch increases (reticulation becomes coarse), the reticulated soft electrode is easily embedded in the insulating layer when it is integrated with the insulating layer. Examples of the planar shape of the voids may include a circle, an ellipse, a polygon such as a rectangle or a rhombus. Further, a ratio of the line width to the pitch is preferably 1:10 to 10:1. Also, an area ratio of the line to the voids is preferably 1:10 to 10:1, and more preferably 1:3 to 3:1.

In order to perform accurate sensing, a distance between the two electrode layers disposed to sandwich the insulating layer therebetween is important. Therefore, a thickness of the reticulated soft electrode of the present invention is preferably as uniform as possible. For example, a change rate in thickness [(maximum thickness−minimum thickness)/minimum thickness×100] of the reticulated soft electrode is preferably 50% or less.

[Capacitance Sensor]

The capacitance sensor of the present invention includes two electrode layers and an insulating layer disposed between the electrode layers, and at least one of the two electrode layers includes the reticulated soft electrode of the present invention described above. The capacitance sensor of the present invention includes a detection electrode layer which is one of the two electrode layers and a shield electrode layer which is the other thereof and configured to shield noise with respect to the detection electrode layer, and may be a sensor that detects a capacitance generated between the detection electrode layer and an object to be detected, or may be a sensor that detects a capacitance between the two electrode layers.

(1) Electrode Layer

The reticulated soft electrode of the present invention may be used for only one of the two electrode layers, but it is more preferable to use the reticulated soft electrode of the present invention for both of them. The reticulated soft electrode of the present invention is as described above. In addition, a conductive sheet, a conductive fabric, or the like formed of a conductive polymer that has been made into a coating material may be used for an electrode layer that does not use the reticulated soft electrode of the present invention.

(2) Insulating Layer

A material of the insulating layer is not particularly limited as long as it has insulating properties and flexibility, such as a resin and an elastomer. Among them, the insulating layer preferably has a thermoplastic elastomer in consideration of flexibility and integral formability with the electrode layer. The thermoplastic elastomer may be appropriately selected from elastomers of styrene-type, olefin-type, vinyl chloride-type, urethane-type, ester-type, amide-type, and the like. The thermoplastic elastomer used may be one type or two or more types. For example, as the styrene-based thermoplastic elastomer, SBS, SEBS, SEPS, and the like may be exemplified. As the olefin-based elastomer, a copolymer of ethylene and an $\alpha$-olefin (ethylene-octene copolymer) or the like can be exemplified in addition to EEA, EMA, EMMA, and the like.

The insulating layer may contain a rubber or a resin other than the thermoplastic elastomer. For example, when a rubber such as ethylene-propylene rubber (EPM, EPDM) is contained, flexibility of the insulating layer improves. From a viewpoint of improving flexibility of the insulating layer, a component imparting flexibility such as a plasticizer may be contained in the insulating layer. Also, from a viewpoint of increasing thermal conductivity of the insulating layer, an inorganic filler having a relatively high thermal conductivity and insulating properties may be contained in the insulating layer. As the inorganic filler having a relatively high thermal conductivity, magnesium oxide, aluminum oxide, aluminum nitride, boron nitride, silicon carbide, or the like can be exemplified.

From a viewpoint of securing insulating properties between the two electrode layers, a volume resistivity of the insulating layer is preferably $1\times10^{12}$ $\Omega\cdot$cm or more. A preferred volume resistivity is $1\times10^{13}$ $\Omega\cdot$cm or more. Also, from a viewpoint of improving an efficiency of assembling the capacitance sensor on a member and durability thereof, a tensile strength of the insulating layer is preferably 0.1 MPa or more, and more preferably 2.0 MPa or more. An elongation at break of the insulating layer is preferably 100% or more, and more preferably 500% or more.

(3) Integration of Electrode Layer and Insulating Layer

In the capacitance sensor of the present invention, the two electrode layers and the insulating layer need only be laminated. The insulating layer may be impregnated in the electrode layers or may be simply in contact with the electrode layers without being impregnated in the electrode layers. Alternatively, an adhesive layer may be interposed between the insulating layer and each of the electrode layers. When the electrode layer is the reticulated soft electrode of the present invention, adhesiveness of the reticulated soft electrode and the insulating layer can be utilized to fix them to each other. Also, when the reticulated soft electrode is superposed on the insulating layer that has been softened by heating, and the insulating layer is fused to the reticulated soft electrode, both of them can be fixed to each other. At this time, a pressure may be applied in the lamination direction so that a part of the softened insulating layer is impregnated into the voids of the reticulated soft electrode. By doing as such, at least a part of the reticulated soft electrode is embedded in the insulating layer. The entire reticulated soft electrode may also be embedded in the insulating layer.

(4) Application

The capacitance sensor of the present invention may be disposed in a planar shape or disposed to be wound around a member. The capacitance sensor of the present invention is suitable for a sensor that detects proximity and contact of a person while being disposed in interior components such as a door trim, an armrest, a console box, an instrument panel, a headrest, a seat, or the like in addition to a steering wheel of a vehicle. Further, when the capacitance sensor of the present invention is applied to the steering wheel as in the first embodiment, the rim part does not necessarily need to have a heater disposed therein. Also, the capacitance sensor is also suitable as a sensor used in a driver monitoring system. For example, the capacitance sensor of the present invention can be laid on a vehicle seat to detect a pressure distribution and a pressure change of a seated occupant. Movement of a center of gravity and a change of a posture can be estimated on the basis of the detected pressure change, and a respiration rate and a heart rate can be measured on the basis of the pressure change.

[Method for Manufacturing Capacitance Sensor]

A method for manufacturing a capacitance sensor of the present invention is a method for manufacturing the capacitance sensor of the present invention in which two electrode layers include the reticulated soft electrode, and the method includes an electrode manufacturing step and a laminating step.

(1) Electrode Manufacturing Step

The present step is a step of manufacturing a reticulated soft electrode. In the present step, first, a conductive material is added to a polymer, and an oil, a dispersant, or the like is added if necessary, and then is kneaded to manufacture a conductive composition (conductive composition manufacturing step). For kneading, a normally used device such as a Banbury mixer, a kneader, a twin-screw kneader, or a twin-screw extruder may be used. Next, the conductive composition is formed into a reticulated shape (forming step). In forming the reticulated shape, a method such as extrusion forming, a gravure printing, press forming, or embossing may be used. When extrusion forming is used, forming can be relatively simply performed at low cost. Among extrusion forming, a relatively fine reticulated shape can be obtained when rotary extrusion forming is used. When the extrusion forming is used, since a thickness at an intersection of lines tends to be larger than thicknesses other than that, press processing or the like may be performed as a post processing to make the thicknesses more uniform. The melt transfer is a method utilizing a gravure printing technology. When a melt transfer is used, a thin film-like electrode having a fine reticulated shape and a uniform thickness can be formed. When press forming is used, a line width, a thickness, a pitch, or the like can be fabricated with high accuracy, and a complex planar shape can be formed. For example, perforating processing may be performed after a sheet shape is formed by the press forming. The embossing is a method in which a film is subjected to perforating processing and then drawn using a sharp embossing roll and an elastic roll in combination. When embossing is used, an electrode having a fine reticulated shape and a uniform thickness can be formed, but since drawing processing is required, it is necessary to consider a change of conductivity.

(2) Laminating Step

The present step is a step of laminating the manufactured reticulated soft electrode on both front and back surfaces of the insulating layer. For example, when the insulating layer is made of a thermoplastic elastomer, adhesiveness of the insulating layer and the reticulated soft electrode can be utilized to fix them to each other. The present step may include a fusing bonding step of fusing and bonding the insulating layer and the reticulated soft electrode together. That is, when the reticulated soft electrode is superposed on the insulating layer after the insulating layer is heated and softened, both of them need only be fused. A heating temperature thereof may be a temperature at which the insulating layer is softened and a temperature at which a shape and physical properties of the reticulated soft electrode do not easily change. For example, about 160 to 200° C. is suitable. Further, the present step may include an embedding step of embedding at least a part of the reticulated soft electrode in the insulating layer by applying a pressure. For example, the laminate of the insulating layer and the reticulated soft electrode may be pressed in the lamination direction so that a part of the insulating layer is impregnated into the voids of the reticulated soft electrode. Alternatively, in the fusing bonding step, the laminate of the insulating layer and the reticulated soft electrode may be pressed in the lamination direction so that a part of the softened insulating layer is impregnated into the voids of the reticulated soft electrode.

EXAMPLES

Next, the present invention will be described more specifically with reference to examples.
<Manufacture of Conductive Polymer>

Example 1

First, carbon black ("Ketjen Black EC600JD" manufactured by Lion Specialty Chemicals Co., Ltd.) as a conductive material was added to a polymer in which a polymethylpentene copolymer ("TPX (registered trademark) MX004" manufactured by Mitsui Chemicals, Inc.), a hydrogenated styrene-based thermoplastic elastomer (SEBS) ("Tuftec (registered trademark) H1221" manufactured by Asahi Kasei Co., Ltd.), and paraffin oil ("Diana (registered trademark) Process Oil PW-380" manufactured by Idemitsu Kosan Co., Ltd.) were blended in in a mass ratio of 50:100:100, and this was kneaded at a temperature of 230° C. using a twin-screw extruder for compounding ("TEX (registered trademark) 25αIII" manufactured by Japan Steel Works, Ltd.) to manufacture a pellet-shaped conductive composition. Next, the conductive composition was placed on a mold and melted with sufficient temperature control at 250° C., hot pressed using a press forming machine (150-ton press manufactured by Sanyu Industry Co., Ltd.), then cooled with the mold closed, and thereby a conductive polymer sheet was manufactured. In the manufactured sheet, there are two types of thicknesses including 0.2 mm and 2 mm.

Examples 2 and 3

Conductive polymer sheets of examples 2 and 3 were manufactured in the same manner as in example 1 except that a blending amount of carbon black as a conductive material was changed.

Example 4

A conductive polymer sheet of example 4 was manufactured in the same manner as in example 1 except that the mass ratio of the three components in the polymer was changed.

Example 5

A conductive polymer sheet of example 5 was manufactured in the same manner as in example 1 except that the polymer was changed to only a urethane-based thermoplastic elastomer ("Resamine (registered trademark) PH890" manufactured by Dainichiseika Kogyo Co., Ltd.), the kneading temperature was changed to 200° C., and the control and melting temperature of the conductive composition were changed to 220° C.

Examples 6 and 7

Conductive polymer sheets of examples 6 and 7 were manufactured in the same manner as in example 5 except that the blending amount of carbon black as a conductive material was changed.

Example 8

A conductive polymer sheet of example 8 was manufactured in the same manner as in example 1 except that the polymer was changed to one in which the hydrogenated styrene-based thermoplastic elastomer (the same as above) and the paraffin oil (the same as above) were blended in in a mass ratio of 50:50.

Comparative Example 1

A conductive fabric ("Sui-10-511M" manufactured by Seiren Co., Ltd.) using polyethylene terephthalate (PET) fibers coated with copper and nickel, instead of the conductive polymer sheet, was used as a sample of comparative example 1.

Comparative Example 2

A conductive fabric obtained by reducing a yarn density of the conductive fabric of comparative example 1 to 68 yarns/inch was used as a sample of comparative example 2.

Comparative Example 3

A conductive polymer sheet of comparative example 3 was manufactured in the same manner as in example 1 except that the polymer was changed to only the polymethylpentene copolymer (the same as above).

Comparative Example 4

A polymer sheet of comparative example 4 was manufactured in the same manner as in example 1 except that the polymer was changed to one in which the hydrogenated styrene-based thermoplastic elastomer (the same as above) and the paraffin oil (the same as above) were blended in in a mass ratio of 50:50, and carbon black as a conductive material was not blended. The polymer of comparative example 4 is not included in the concept of the conductive polymer of the present invention in that no conductive material is contained.

<Measurement of Physical Properties of Conductive Polymer>

Physical properties of the manufactured conductive polymers were measured. Measurement items and measurement methods are as follows. Further, physical properties of the polymer of comparative example 4 except volume resistivity were measured in the same manner.

[Elastic Modulus, Tensile Strength, Elongation at Break]

A tensile test specified in JIS K6251:2017 was performed, a tensile strength and an elongation at break were measured, and an elastic modulus was calculated from a slope of a linear region of a stress-elongation curve. The elongation at break has the same meaning as the elongation at break ($E_b$) specified in the JIS described above. The tensile test was performed using a dumbbell-shaped No. 5 type test piece fabricated from a conductive polymer sheet having a thickness of 2 mm at room temperature and at a tensile speed of 100 mm/min. Also, the tensile test was performed also at 120° C. and 180° C. in the same manner, an elongation at break at each temperature was measured, and an elastic modulus was calculated from a slope of a linear region of a stress-elongation curve.

[Melt Viscosity]

Measurement was performed using "Capirograph (registered trademark) 1D PMD-C" (in accordance with JIS K7199:1999) manufactured by Toyo Seiki Seisaku-sho, Ltd. The measurement was performed under conditions of a temperature of 200° C. and a shear rate of 61 s$^{-1}$.

[Volume Resistivity]

Volume resistivity of a conductive polymer sheet having a thickness of 0.2 mm was measured using a low resistivity meter "Loresta (registered trademark) GP" (voltage: 5 V, in accordance with JIS K7194:1994) manufactured by Mitsubishi Chemical Analytech Co., Ltd. The measured volume resistivity was set as an initial volume resistivity (before the elongation).

[Volume Resistivity at 25% Elongation]

A conductive polymer sheet having a thickness of 0.2 mm was perforated to fabricate a dumbbell-shaped No. 2 type test piece specified in JIS K6251:2010. A copper foil was attached at positions 10 mm from both ends of the test piece. A pair of marked lines were drawn at positions 10 mm on both sides from a center of the test piece in a longitudinal direction, and a distance between the marked lines of 20 mm was set on the test piece. First, an electric resistance value R1 between the copper foils was measured when a voltage of 1 V was applied. Next, one end of the test piece was pulled and elongated until the distance between the marked lines became 25 mm (elongation rate 25%: (25−20)/20× 100=25), and an electric resistance value R2 between the copper foils was measured. A change ratio (R2/R1) was calculated by dividing the electric resistance value R2 by the electric resistance value R1. Then, the calculated change ratio was multiplied by the above-described initial volume resistivity to obtain volume resistivity at 25% elongation.

[After PCT Test, Proportional Change of Volume Resistivity and Retention Rate of Elongation at Break after PCT Test]

In order to measure a proportional change of a volume resistivity, a conductive polymer sheet having a thickness of 0.2 mm was perforated to fabricate a test piece of 80 mm×60 mm square in accordance with JIS K7194:1994. In order to measure a retention rate of elongation at break, a conductive polymer sheet having a thickness of 0.2 mm was perforated to fabricate a dumbbell-shaped No. 2 type test piece specified in JIS K6251:2010. Each test piece was put into a pressure cooker test tester and kept at 121° C. and 202.65 kPa (2 atm) for 120 hours. Thereafter, the test pieces were taken out, and volume resistivity and an elongation at break after the PCT test were measured using the above-described measurement method. Then, the proportional change of the volume resistivity and the retention rate of the elongation at break were calculated by foregoing expressions (i) and (ii).

<Evaluation of Physical Properties of Conductive Polymer>

Measurement results of compositions and physical properties of the manufactured conductive polymer are summarized in Tables 1 and 2. In the tables, a blending proportion of the conductive material is represented by parts by mass of the conductive material with respect to 100 parts by mass of the polymer. Further, volume resistivity of the conductive fabrics of comparative examples 1 and 2 is a reference value calculated from surface resistivity, and volume resistivity at 25% elongation and volume resistivity after the PCT test were measured in the same manner as in the conductive polymer. At the time of measurement, warp yarns and weft yarns of the conductive fabric were set to be parallel and perpendicular to a pulling direction.

TABLE 1

| | | Example 1 | Example 2 | Example 3 | Example 4 | Example 5 | Example 6 | Example 7 | Example 8 |
|---|---|---|---|---|---|---|---|---|---|
| Composition | Polymer (mixing ratio) | TPX/SEBS/ paraffin oil (55/100/100) | ← | ← | TPX/SEBS/ paraffin oil (55/100/150) | Urethane-based thermoplastic elastomer | ← | ← | SEBS/ paraffin oil (50/50) |
| | Conductive material | Carbon black | ← | ← | ← | ← | ← | ← | ← |
| | Blending proportion of conductive material (parts by mass) | 13 | 9 | 17 | 13 | 13 | 9 | 17 | 13 |
| Physical properties | Elastic modulus [MPa] | 40 | 3 | 55 | 26 | 160 | 120 | 230 | 15 |
| | Tensile strength [MPa] | 6.5 | 4.9 | 7.3 | 5.1 | 32 | 32 | 30 | 8 |
| | Elongation at break [%] | 450 | 480 | 250 | 450 | 210 | 280 | 150 | 500 |
| | Melt viscosity at 200° C. [Pa · s] | 10000 or more | 10000 or more | 10000 or more | 10000 or more | 9060 | 4200 | — | 4100 |
| | Elastic modulus at 120° C. [MPa] | — | — | — | — | — | — | — | 1.5 |
| | Elongation at break at 120° C. [%] | — | — | — | — | — | — | — | 10 or less |
| | Elastic modulus at 180° C. [MPa] | 2.0 | 1.6 | 2.4 | 1.0 | 2.0 | 1.5 | 2.3 | 0.3 |
| | Elongation at break at 180° C. [%] | 25 | 25 | 15 | 15 | 20 | 20 | 18 | 5 |
| | Volume resistivity before elongation [Ω · cm] | 2.0 | 9.0 | 1.5 | 4.0 | 1.8 | 7.2 | 1.3 | 2.3 |
| | Volume resistivity at 25% elongation [Ω · cm] | 4.0 | 21 | 2.3 | 10 | 3.0 | 16.0 | 2.7 | 4.8 |

TABLE 1-continued

|  |  | Example 1 | Example 2 | Example 3 | Example 4 | Example 5 | Example 6 | Example 7 | Example 8 |
| --- | --- | --- | --- | --- | --- | --- | --- | --- | --- |
|  | Change in volume resistivity due to elongation [times] | 2.0 | 2.3 | 1.5 | 2.5 | 1.7 | 2.2 | 2.1 | 2.1 |
|  | Volume resistivity after PCT test [Ω·cm] | 2.0 | 9.0 | 1.5 | 4.0 | 1.8 | 7.2 | 1.3 | 2.3 |
|  | Change rate of volume resistivity after PCT test [%] | 0 | 0 | 0 | 0 | 0 | 0 | 0 | 0 |
|  | Elongation at break after PCT test [%] | 450 | 485 | 243 | 441 | 172 | 232 | 125 | 475 |
|  | Retention rate of elongation at break after the PCT test [%] | 100 | 101 | 97 | 98 | 82 | 83 | 83 | 95 |
| Evaluation | Integral formability | ○ | ○ | ○ | ○ | ○ | ○ | ○ | ○ |
|  | Ease of attachment | ○ | ○ | ○ | ○ | ○ | ○ | ○ | ○ |
|  | Sensing performance | ○ | ○ | ○ | ○ | ○ | ○ | ○ | ○ |

TABLE 2

|  |  | Comparative example 1 | Comparative example 2 | Comparative example 3 | Comparative example 4 |
| --- | --- | --- | --- | --- | --- |
| Composition | Polymer (mixing ratio) | Conductive fabric | Conductive fabric (Yarn density 68 yarns/inch) | TPX | SEBS/paraffin oil (50/50) |
|  | Conductive material |  |  | Carbon black | — |
|  | Blending proportion of conductive material (parts by mass) |  |  | 13 | — |
| p | Elastic modulus [MPa] | — | — | 1300 | 2.5 |
|  | Tensile strength [MPa] | — | — | 15 | 3.5 |
|  | Elongation at break [%] | — | — | 3 | 750 |
|  | Melt viscosity at 200° C. [Pa·s] | — | — | — | 950 |
|  | Elastic modulus at 120° C. [MPa] | — | — | — | 0.2 |
|  | Elongation at break at 120° C. [%] | — | — | — | 8 or less |
|  | Elastic modulus at 180° C. [MPa] | — | — | 15 | unmeasurable |
|  | Elongation at break at 180° C. [%] | — | — | 2 | unmeasurable |
|  | Volume resistivity before elongation [Ω·cm] | $2.4 \times 10^{-3}$ | $2.4 \times 10^{-3}$ | 1.7 | — |
|  | Volume resistivity at 25% elongation [Ω·cm] | Broken | Broken | Broken | — |
|  | Change in volume resistivity due to elongation [times] | — | — | — | — |
|  | Volume resistivity after PCT test [Ω·cm] | $2.4 \times 10^{-3}$ | $2.4 \times 10^{-3}$ | 1.7 | — |
|  | Change rate of volume resistivity after PCT test [%] | 0 | 0 | 0 | — |
|  | Elongation at break after PCT test [%] | — | — | 3.1 | 698 |
|  | Retention rate of elongation at break after the PCT test [%] | — | — | 102 | 93 |
| Evaluation | Integral formability | x | Δ | ○ | x |
|  | Ease of attachment | — | x | x | — |
|  | Sensing performance | — | ○ | ○ | - |

As shown in Table 1, it was ascertained that elastic moduli of the conductive polymers of the examples were 230 MPa at the maximum, and these conductive polymers had high flexibility. Also, tensile strengths and elongations at break were also satisfactory values. Volume resistivity before the elongation was 7.2 Ω·cm at the maximum and increased only to 3 times or less even at 25% elongation. That is, it was ascertained that the conductive polymers of the examples had desired conductivity and the conductivity did not easily deteriorate even when the conductive polymers were elongated. Even after the PCT test, changes in volume resistivity and elongation at break were small. Thereby, it was ascertained that the conductive polymers could withstand use in an interior of an automobile over a long period of time. On the other hand, the conductive fabrics of comparative examples 1 and 2 broke when they were elongated by 25% as shown in Table 2. Also, an elastic modulus of the conductive polymer of comparative example 3 was extremely large. Therefore, the conductive polymer of comparative example 3 was poor in flexibility and broke when it was elongated by 25%.

As described above, it is ascertained that the conductive polymers of the examples are suitable for the reticulated soft electrode for a capacitance sensor of the present invention. Further, an elastic modulus and an elongation at break at 120° C. and 180° C., and a melt viscosity at 200° C. will be described below in the evaluation of the capacitance sensor.

<Manufacture of Capacitance Sensor>

First, the conductive compositions manufactured in the examples and comparative example 3 were each press-formed to manufacture an electrode having a reticulated shape. Specifically, the conductive composition was placed on a mold having a reticulated shaped mold surface, melted at 250° C., and then pressed to manufacture a reticulated electrode. The obtained electrode has a square shape with a length of 60 mm and a width of 60 mm, a thickness of 0.2 mm, a line width of 0.8 mm, and a pitch of 3 mm. Further, the polymer of comparative example 4 having no conductivity was also press-formed in the same manner to manufacture an electrode having a reticulated shape.

Next, an insulating layer was manufactured. A method of manufacturing an insulating layer is as follows. First, 200 parts by mass of magnesium oxide powder ("RF-50SC" manufactured by Ube Material Industries, Ltd.) as an inorganic filler was added to 100 parts by mass of a hydrogenated styrene-based thermoplastic elastomer (SEBS) ("Tuftec (registered trademark) H1221" manufactured by Asahi Kasei Co., Ltd.) and 50 parts by mass of an olefin-based thermoplastic elastomer ("Engage (registered trademark) XLT8677" manufactured by Dow Chemical Japan Ltd.), and this was kneaded at a temperature of 200° C. using a twin-screw extruder for compounding (the same as above) to manufacture a pellet-shaped insulating composition. Next, the insulating composition was subjected to T-die extrusion processing using a single-screw extruder ("UT-25" manufactured by Research Laboratory of Plastics Technology Co., Ltd.) to manufacture an elastomer sheet having a width of 150 mm and a thickness of 1 mm. The obtained elastomer sheet was perforated into a square shape having a length of 60 mm and a width of 60 mm to form an insulating layer. When an elastic modulus and an elongation at break of the insulating layer (elastomer sheet) at 120° C. and 180° C. and a melt viscosity thereof at 200° C. were measured in the same manner as in the conductive polymer sheets, the elastic modulus at 120° C. was 1.8 MPa, the elastic modulus at 180° C. was 0.5 MPa, the elongation at break at 120° C. was 10%, the elongation at break at 180° C. was 10%, and the melt viscosity at 200° C. was 3500 Pa·s.

Then, the reticulated electrode was superposed on both surfaces (front surface and back surface) one by one in a thickness direction of the insulating layer, pressed at 200° C. and a pressure of 0.1 to 1 MPa for about 5 minutes, and then cooled. In this way, a capacitance sensor formed of the electrode layer/insulating layer/electrode layer was manufactured.

Each of the conductive fabrics of comparative examples 1 and 2 was disposed on both sides in the thickness direction of the insulating layer as it was, and hot pressed under the same conditions as in the reticulated electrode. Hereinafter, a capacitance sensor having the reticulated electrode manufactured from the conductive compositions of the examples will be referred to as a capacitance sensor of the example. Similarly, as for the comparative example, it will be referred to as a capacitance sensor of the comparative example.

Further, the capacitance sensor of the example is included in the concept of the capacitance sensor of the present invention.

<Evaluation of Capacitance Sensor>

(1) Evaluation Item and Evaluation Method

[Integral Formability]

A cross section in a thickness direction of the capacitance sensor was visually observed to evaluate the integral formability. The evaluation for the integral formability was made such that a state in which the reticulated shape of the electrode was maintained, and the electrode was embedded and fused in the insulating layer was regarded as satisfactory (indicated by a symbol ○ in Tables 1 and 2 above), a state in which the reticulated shape of the electrode was maintained and only a part of the electrode was embedded and fused in the insulating layer was regarded as normal (indicated by a symbol Δ in the tables), and a state in which the electrode was not embedded in the insulating layer at all, and the reticulated shape of the electrode was not maintained or not fused was regarded as poor (indicated by a symbol x in the tables).

[Ease of Attachment (Flexibility)]

Ease with which the capacitance sensor was attached to a member was evaluated by a sense at the time of the capacitance sensor being elongated by 10% by a hand. The evaluation for the ease of attachment was made such that a case in which a square-shaped sensor can be easily elongated in all directions was regarded as satisfactory (indicated by a symbol ○ in Tables 1 and 2 above), and a state in which a square-shaped sensor is not easily elongated in all directions or in a specific direction was regarded as poor (indicated by symbol x in the tables).

[Sensing Performance]

Terminals were attached to two electrode layers, an LCR meter ("IM3533" manufactured by Hioki E.E. Corporation) was used to apply an alternate current (AC) voltage of V (frequency: 10 to 100 kHz) and measure a phase difference between a current and a voltage, and thereby a sensing performance was evaluated. The evaluation for the sensing performance was made such that a case in which a phase difference is $\pi/2 \pm 5°$ in an entire frequency range described above was regarded as having a high sensing performance (indicated by a symbol ○ in Tables 1 and 2 above), and a case in which a phase difference deviates from $\pi/2 \pm 1°$ at a certain frequency in the above-described frequency range was regarded as having a low sensing performance (indicated by a symbol x in the table).

(2) Evaluation Result

Evaluation results of the capacitance sensor are summarized in Tables 1 and 2 above. As shown in Table 1, in the capacitance sensors of the examples, both the integral formability and the ease of attachment were satisfactory, and the sensing performance was also high. Further, the elastic modulus and the elongation at break of the conductive polymers of examples 1 to 7 at 180° C. were larger than those of the insulating layer (elastic modulus: 0.5 MPa, and elongation at break: 10% in the insulating layer). That is, the conductive polymers of examples 1 to 7 satisfy the above-described conditions (A) and (B). The melt viscosity of the conductive polymers of examples 1 to 6 at 200° C. was higher than that of the insulating layer (melt viscosity of the insulating layer: 3500 Pa·s). That is, the conductive polymers of examples 1 to 6 satisfy (C) in addition to the above-described conditions (A) and (B). Also, regarding the conductive polymer of example 8, the elastic modulus at 120° C. and 180° C. was smaller than that of the insulating layer, and the elongation at break at 120° C. and 180° C. was equal to or less than that of the insulating layer, but the melt viscosity at 200° C. was larger than that of the insulating layer. That is, the conductive polymer of example 8 satisfies the above-described condition (C). Therefore, in the capacitance sensors of the examples, it is thought that deformation of the electrode layer, change in mechanical properties and physical properties, or the like was small when the electrode layer was integrated with the insulating layer under heating. On the other hand, in the capacitance sensor of comparative example 4 manufactured for a reference, the integral formability was poor. It is thought that this is because, since the elastic modulus and the elongation at break of the polymer of comparative example 4 at 120° C. and the melt viscosity thereof at 200° C. were all smaller than those of the insulating layer (the elastic modulus and the elongation at break could not be measured at 180° C.), the above-described conditions (A) to (C) were not satisfied, and the electrode layer (polymer of comparative example 4) was deformed by heat when it was integrated with the insulating layer.

As shown in Table 2, in the capacitance sensor of comparative example 1, integral formability was poor, and in the capacitance sensor of comparative example 2, integral formability was slightly improved but attachability was poor. It is thought that this is because the conductive fabric of comparative example 2 is poor in flexibility but has a smaller yarn density than the conductive fabric of comparative example 1, and thereby allowing the insulating layer to be easily impregnated therein. The capacitance sensor of comparative example 3 was poor in flexibility, and therefore had poor attachability.

What is claimed is:

1. A capacitance sensor which is a capacitance sensor comprising:
    two electrode layers; and
    an insulating layer disposed between the electrode layers, wherein
    at least one of the two electrode layers comprises a reticulated soft electrode having a reticulated shape formed of a conductive polymer,
    the conductive polymer comprises a polymer and a conductive material dispersed in the polymer and has an elastic modulus of 1000 MPa or less, and
    the polymer of the conductive polymer comprises one or more types selected from thermoplastic resins and thermoplastic elastomers.

2. The capacitance sensor according to claim 1, wherein the reticulated soft electrode has a thickness of 0.05 mm or more and 0.5 mm or less.

3. The capacitance sensor according to claim 1, wherein the conductive material of the conductive polymer comprises one or more types selected from carbon black, carbon nanotubes, and graphite.

4. The capacitance sensor according to claim 1, wherein a volume resistivity of the conductive polymer is 100 Ω·cm or less.

5. The capacitance sensor according to claim 1, wherein a volume resistivity when the conductive polymer is elongated in one direction by 25% is 10 times a volume resistivity before the elongation or less.

6. The capacitance sensor according to claim 1, wherein the insulating layer comprises a thermoplastic elastomer.

7. The capacitance sensor according to claim 1 which satisfies at least one of the following conditions (A), (B), and (C):
    (A) An elastic modulus of the conductive polymer at a certain temperature of 120° C. or higher and 180° C. or lower is higher than an elastic modulus of the insulating layer measured at the same temperature;
    (B) An elongation at break of the conductive polymer at a certain temperature of 120° C. or higher and 180° C. or lower is larger than an elongation at break of the insulating layer measured at the same temperature; and
    (C) A melt viscosity of the conductive polymer at 200° C. is higher than a melt viscosity of the insulating layer at 200° C.

8. The capacitance sensor according to claim 1, wherein at least a part of the reticulated soft electrode is embedded in the insulating layer.

9. The capacitance sensor according to claim 1, comprising a detection electrode layer which is one of the two electrode layers and a shield electrode layer which is the other thereof, and
    detecting a capacitance generated between the detection electrode layer and an object to be detected.

10. The capacitance sensor according to claim 9 which is disposed in a steering wheel.

11. A method for manufacturing a capacitance sensor which is a method for manufacturing a capacitance sensor comprising:
    two electrode layers; and
    an insulating layer disposed between the electrode layers, in which
    the two electrode layers comprises a reticulated soft electrode having a reticulated shape formed of a conductive polymer,
    the conductive polymer comprises a polymer and a conductive material dispersed in the polymer and has an elastic modulus of 1000 MPa or less, and
    the polymer of the conductive polymer comprises one or more types selected from thermoplastic resins and thermoplastic elastomers,
    the method for manufacturing a capacitance sensor comprising:
    an electrode manufacturing step of manufacturing the reticulated soft electrode, and
    a laminating step of laminating the reticulated soft electrode on both front and back surfaces of the insulating layer.

12. The method for manufacturing a capacitance sensor according to claim 11, wherein the laminating step comprises a fusing bonding step of fusing and bonding the insulating layer and the reticulated soft electrode.

13. The method for manufacturing a capacitance sensor according to claim 11, wherein the laminating step comprises an embedding step of embedding at least a part of the reticulated soft electrode in the insulating layer by applying a pressure.

14. The method for manufacturing a capacitance sensor according to claim 11, wherein, in the electrode manufacturing step, a conductive composition comprising the polymer and the conductive material is formed into a reticulated shape by extrusion forming, a melt transfer, press forming, or embossing.

15. A reticulated soft electrode for a conductive sensor,
    formed of a conductive polymer comprising a polymer and a conductive material dispersed in the polymer and having an elastic modulus of 1000 MPa or less,
    having a reticulated shape, and
    the polymer comprises one or more types selected from thermoplastic resins and thermoplastic elastomers.

16. The reticulated soft electrode for a conductive sensor according to claim 15 having a thickness of 0.05 mm or more and 0.5 mm or less.

17. The reticulated soft electrode for a conductive sensor according to claim 16, wherein a volume resistivity of the conductive polymer is 100 Ω·cm or less.

18. The reticulated soft electrode for a conductive sensor according to claim 15, wherein the conductive material comprises one or more types selected from carbon black, carbon nanotubes, and graphite.

19. The reticulated soft electrode for a conductive sensor according to claim 15, wherein a volume resistivity when the conductive polymer is elongated in one direction by 25% is 10 times a volume resistivity before the elongation or less.

* * * * *